(12) United States Patent
Xu et al.

(10) Patent No.: US 12,027,227 B2
(45) Date of Patent: Jul. 2, 2024

(54) LOW POWER MANAGEMENT FOR SLEEP MODE OPERATION OF A MEMORY DEVICE

(71) Applicant: MICRON TECHNOLOGY, INC., Boise, ID (US)

(72) Inventors: Shuai Xu, Santa Clara, CA (US); Michele Piccardi, Cupertino, CA (US); Arvind Muralidharan, Folsom, CA (US); June Lee, Sunnyvale, CA (US); Qisong Lin, El Dorado Hills, CA (US); Scott A. Stoller, Boise, ID (US); Jun Shen, Shanghai (CN)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 17/426,963

(22) PCT Filed: Dec. 22, 2020

(86) PCT No.: PCT/CN2020/138229
§ 371 (c)(1),
(2) Date: Jul. 29, 2021

(87) PCT Pub. No.: WO2022/133705
PCT Pub. Date: Jun. 30, 2022

(65) Prior Publication Data
US 2023/0317120 A1   Oct. 5, 2023

(51) Int. Cl.
*G11C 5/14* (2006.01)

(52) U.S. Cl.
CPC .............. *G11C 5/144* (2013.01); *G11C 5/147* (2013.01); *G11C 5/148* (2013.01)

(58) Field of Classification Search
CPC .......... G11C 5/144; G11C 5/147; G11C 5/148
See application file for complete search history.

(56) References Cited

U.S. PATENT DOCUMENTS

| 2005/0010831 | A1 | 1/2005 | Bashford et al. |
| 2009/0024860 | A1 | 1/2009 | Krishnamoorthy |
| 2017/0353107 | A1* | 12/2017 | Shao ............... H02M 3/157 |

FOREIGN PATENT DOCUMENTS

JP           H09292939 A       11/1997

OTHER PUBLICATIONS

PCT Notification of Transmittal Of The International Search Report And The Written Opinion Of The International Searching Authority for PCT Application No. PCT/CN2020/138229, dated Sep. 14, 2021, 8 pages.

* cited by examiner

*Primary Examiner* — Jay W. Radke
(74) *Attorney, Agent, or Firm* — Lowenstein Sandler LLP

(57) ABSTRACT

A determination is made that a memory device of a memory sub-system is to be transitioned to a sleep mode. A command is initiated to cause a standby circuit associated with the memory device to enter into a low power mode while a power supply of the memory sub-system is maintained in a powered state. In the low power mode, a reference voltage is supplied to a voltage regulator of the standby circuit to supply a standby current level to the memory device during the sleep mode.

20 Claims, 7 Drawing Sheets

LOW POWER MANAGEMENT FOR SLEEP MODE OPERATION OF A MEMORY DEVICE

TECHNICAL FIELD

Embodiments of the disclosure relate generally to memory sub-systems, and more specifically, low power mode management for sleep mode operation of a memory device.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
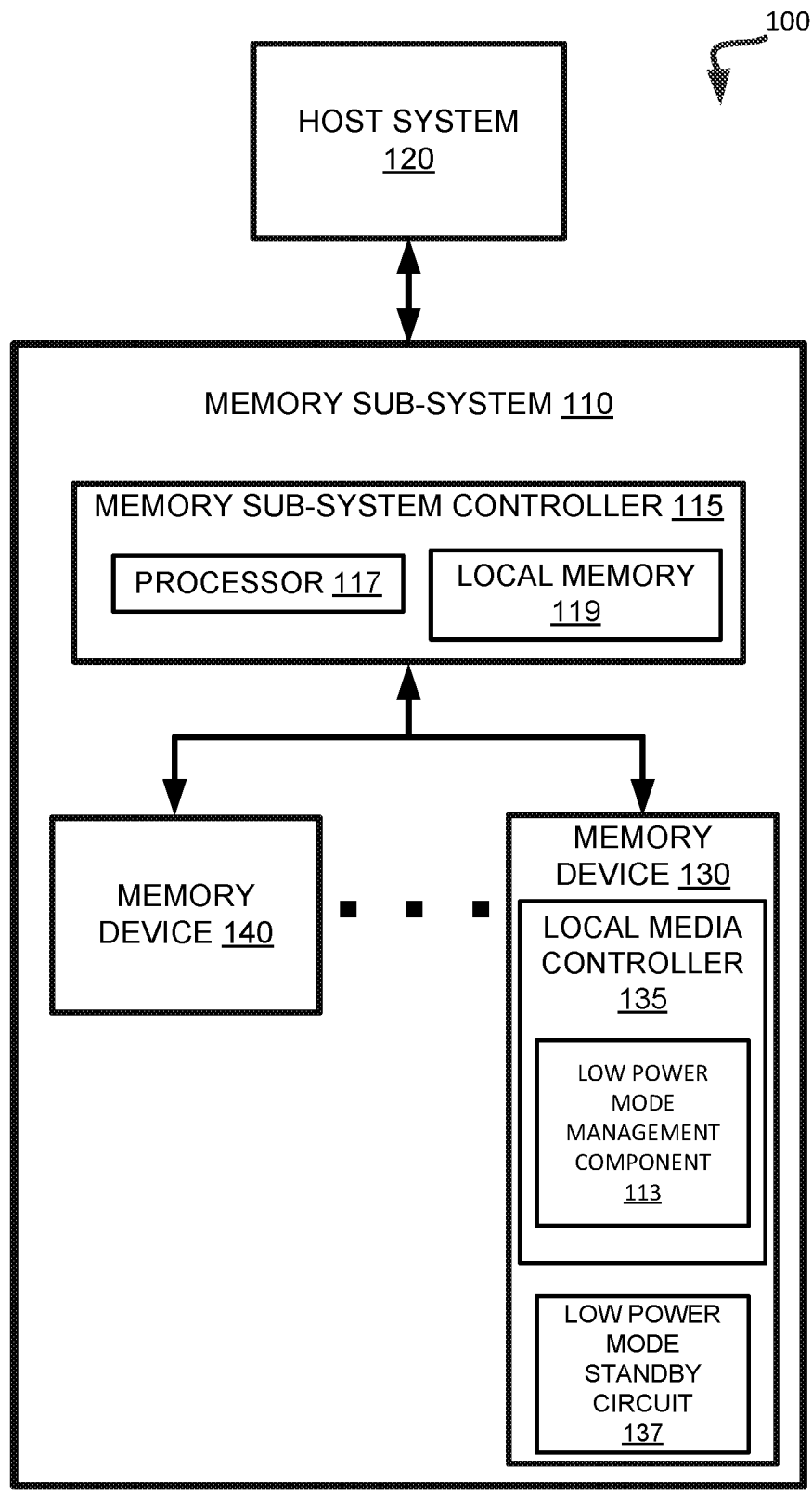
FIG. 1 illustrates an example computing environment that includes a memory sub-system in accordance with some embodiments of the present disclosure.

Aspects of the present disclosure relate to low power mode management for sleep mode operation of a memory device in a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a not-and (NAND) memory device. Other examples of non-volatile memory devices are described below in conjunction with FIG. 1. A non-volatile memory device is a package of one or more memory dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic device or unit that stores information. Depending on the cell type, a cell can store one or more bits of binary information, and has various logic states that correlate to the number of bits being stored. The logic states can be represented by binary values, such as "0" and "1", or combinations of such values.

A memory sub-system can have multiple power states (PS) which are grouped as either an active power state (e.g., Power State 0) or an idle power state (e.g., Power State 4). In an example, a memory sub-system can have a deep idle power state representing a "sleep mode" (e.g., Power State 4). This lowest idle state (herein referred to as a "sleep state" or "sleep mode operation") in a memory sub-system is typically achieved by turning off most hardware logic, memory components, non-volatile memory, and an internal power supply of the memory sub-system. For example, when the memory sub-system enters the sleep state, power to components of the memory sub-system can be turned off to minimize power consumption (e.g., a level of power or energy generated by a power supply) while in the sleep or deep idle state. In view of the loss of power, nonvolatile memory configuration information is lost. After the memory-sub system exits the deep idle state by turning on the power supply again, the memory sub-system needs to initialize the non-volatile memory to restore the configuration information, so non-volatile can perform normal operations.

Initializing non-volatile memory can cause a negative impact to command response time and input/output (IO) performance of the memory sub-system. Initializing non-volatile memory also consumes power, and frequent transitions to and from the sleep mode increases overall power consumption contributing to performance issues (e.g., shorter power supply (e.g., battery) operation time when the memory component is employed on a mobile platform). In addition, frequent power state transitions to the sleep state increases the number of initialization operations to non-volatile memory and produces a negative impact to an endurance of the memory sub-system.

Typical memory sub-system behavior shows a significant number of these power state transitions can occur over short intervals. As a result, entering and exiting to and from an active state to a deep idle state can involve transitioning media (i.e., copying data from volatile memory to non-volatile memory) with energy and thermal consumption. For example, following the transition of a conventional memory sub-system from an active state to the sleep state resulting in the transitioning of media, power consumption (e.g., as a function of a standby current), an increase of required thermal power, and corresponding entry and exit latencies, the host system can send a command to the memory sub-system producing a transition back to the active state. In this example, inefficiencies are produced by the transition to the deep idle state and rapid return transition to the active state.

In an approach, a standby circuit is employed to supply an internal voltage level to the memory device during the sleep mode. The standby circuit includes a bandgap circuit coupled to a voltage regulator and detector component (herein referred to as a "voltage regulator"). The bandgap circuit is used to supply the voltage regulator with power to enable the voltage regulator to regulate a power supply voltage level (e.g., from 3.6V to 2.25V) and generate an output voltage level (herein a "voltage regulator level" or "Vr") and a standby current level ($I_{SB}$) to supply to the memory device and detect standby power during the sleep mode.

This results in a high standby current associated with the internal voltage level generated by the voltage regulator and the consumption of current by the bandgap circuit. To address these issues, in this approach, the standby current is reduced during the sleep mode by powering off a power supply of the memory sub-system (e.g., an internal battery powering the components of the memory sub-system). However, powering off the power supply results in significant longer entry and exit latency times and a reduction in reliability of the data stored by the memory device. In addition, the impact of the longer entry and exit latency times associated with powering down the power supply during the sleep mode is amplified by the increasing level of processing of frequent high-level data bursts (e.g., data bursts while a user watches a movie) that require a wake-up transition (e.g., waking up from the sleep mode (PS4) to an active mode). Disadvantageously, the supplying of voltage to the bandgap component by the power supply results in significant leakage current (e.g., from a controller) when the memory device is in the sleep state (e.g., PS4).

Aspects of the present disclosure address the above and other deficiencies by implementing a low power mode to provide a reference voltage to a voltage regulator to regulate and reduce a standby current consumed during operation of a memory device in an idle or sleep power state, while maintaining a power supply (e.g., a "first power supply" or "internal power supply") in a powered on state during the low power mode.

In an embodiment, a low power mode component is employed to manage entry into and exit from the low power mode. In the low power mode, a bandgap circuit is powered down or shut off to disable consumption of current by the bandgap circuit. In an embodiment, the low power mode component controls the operation of a circuit (herein referred to as a "low power mode circuit") to provide a reference voltage level to the voltage regulator. The supplied reference voltage level (also referred to as a "low power mode reference voltage" or "Vref-lpm") enables the voltage regulator to produce an output voltage (also referred to as "Vreg"). Advantageously, supply of the lower level reference voltage by the low power mode circuit to the voltage regulator results in a lower voltage regulator output voltage and a reduction of a standby current (e.g., reduced to a level of 5 µA or less) during the sleep mode of the memory sub-system. A further advantage is achieved by establishing the low power mode while maintaining operation of the power supply to reduce an exit latency associated with the transition of the memory sub-system from the sleep power state (e.g., PS4) to an active state (e.g., PS0). In addition, maintaining the power supply on avoids the loss of data reliability by eliminating the power cycling of the power supply. Furthermore, a life of the power supply (e.g., an internal battery) is improved by keeping the power supply on during the sleep mode by reducing power cycles and corresponding initialization processing.

FIG. 1 illustrates an example computing system 100 that includes a memory sub-system 110 in accordance with one or more embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical block address (e.g., logical block address (LBA), namespace) and a physical block address (e.g., physical block address) that are associated with the memory devices 130. The memory sub-system controller 115 can further include host interface circuitry to communicate with the host system 120 via the physical host interface. The host interface circuitry can convert the commands received from the host system 120 into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 140, 130). In some embodiments, a memory device 130 is a managed memory device, which includes a raw memory device 130 having control logic (e.g., local media controller 135) on the die and a controller (e.g., memory sub-system controller 115) for media management within the same memory device package. An example of a managed memory device is a managed NAND (MNAND) device.

The memory sub-system 110 includes a low power mode management component 113 to manage the operation of a low power mode standby circuit to supply a managed standby current level to the memory device 130 during sleep mode operation (e.g., an idle or sleep state) of the memory sub-system 110. In an embodiment, the low power mode management component 113 initiates entry into the low power mode to cause a reference voltage level to be supplied by a low power mode reference voltage generator to a voltage regulator while a power supply of the memory sub-system is maintained in a powered state (e.g., an internal power supply, such as a battery of the memory sub-system, remains on). The low power mode reference voltage level (or $V_{REF-LPM}$) causes the voltage regulator to generate an output voltage to supply to the memory device 130 at a reduced standby current level (e.g., 1.8 µA), resulting in a reduced power consumption level. In addition, an improved exit latency (e.g., 125 µs) is achieved by establishing the low power mode while keeping the power supply on to enable the parallel wake-up transition of memory dies of the memory device 140, 130 from the sleep mode to an active mode.

In some embodiments, the local media controller 135 includes at least a portion of the low power mode management component 113. For example, the local media controller 135 can initiate command or signals to control a low power mode standby circuit 137 for performing the operations described herein.

Figure 2:
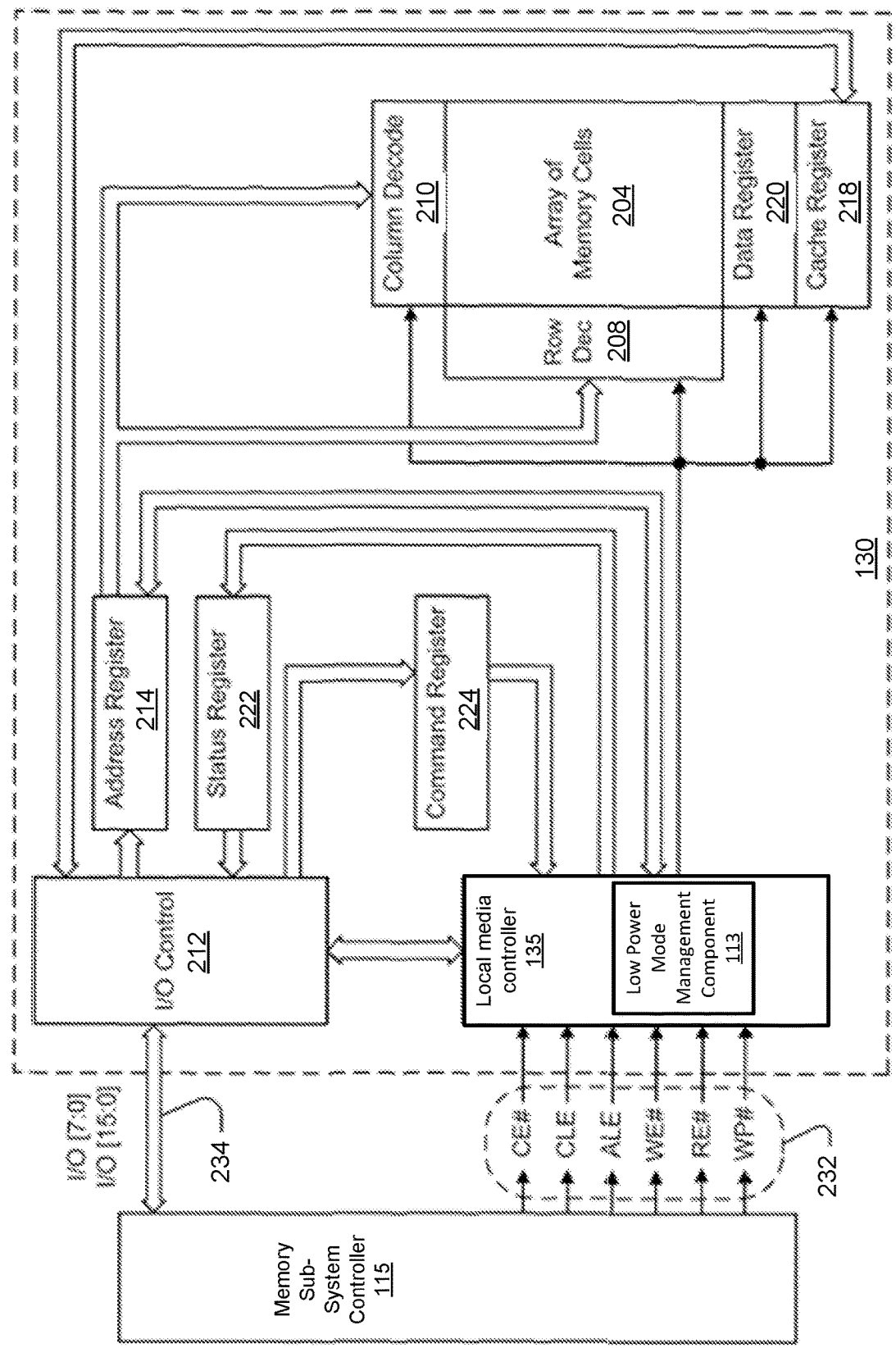
FIG. 2 is a block diagram of a memory device in communication with a memory sub-system controller of a memory sub-system, in accordance with one or more embodiments of the present disclosure.

FIG. 2 is a simplified block diagram of a first apparatus, in the form of a memory device 130, in communication with a second apparatus, in the form of a memory sub-system controller 115 of a memory sub-system (e.g., memory sub-system 110 of FIG. 1), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130 of FIG. 1), may be a memory controller or other external host device.

Memory device 130 includes an array of memory cells 204 logically arranged in rows and columns. Memory cells of a logical row are typically connected to the same access line (e.g., a word line) while memory cells of a logical column are typically selectively connected to the same data line (e.g., a bit line). A single access line may be associated with more than one logical row of memory cells and a single data line may be associated with more than one logical column. Memory cells (not shown in FIG. 2) of at least a portion of array of memory cells 204 are capable of being programmed to one of at least two target data states.

Row decode circuitry 208 and column decode circuitry 210 are provided to decode address signals. Address signals are received and decoded to access the array of memory cells 204. Memory device 130 also includes input/output (I/O) control circuitry 212 to manage input of commands, addresses and data to the memory device 130 as well as output of data and status information from the memory device 130. An address register 214 is in communication with I/O control circuitry 212 and row decode circuitry 208 and column decode circuitry 210 to latch the address signals prior to decoding. A command register 224 is in communication with I/O control circuitry 212 and control logic 216 to latch incoming commands.

A controller (e.g., the local media controller 135 internal to the memory device 130) controls access to the array of memory cells 204 in response to the commands and generates status information for the external memory sub-system controller 115, i.e., the local media controller 135 is configured to perform access operations (e.g., read operations, programming operations and/or erase operations) on the array of memory cells 204. The local media controller 135 is in communication with row decode circuitry 208 and column decode circuitry 210 to control the row decode circuitry 208 and column decode circuitry 210 in response to the addresses.

The local media controller 135 is also in communication with a cache register 218. Cache register 218 latches data, either incoming or outgoing, as directed by the local media controller 135 to temporarily store data while the array of memory cells 204 is busy writing or reading, respectively, other data. During a programming operation (e.g., write operation), data may be passed from the cache register 218 to the data register 220 for transfer to the array of memory cells 204; then new data may be latched in the cache register 218 from the I/O control circuitry 212. During a read operation, data may be passed from the cache register 218 to the I/O control circuitry 212 for output to the memory sub-system controller 115; then new data may be passed from the data register 220 to the cache register 218. The cache register 218 and/or the data register 220 may form (e.g., may form a portion of) a page buffer of the memory device 130. A page buffer may further include sensing devices (not shown in FIG. 2) to sense a data state of a memory cell of the array of memory cells 204, e.g., by sensing a state of a data line connected to that memory cell. A status register 222 may be in communication with I/O control circuitry 212 and the local memory controller 135 to latch the status information for output to the memory sub-system controller 115. In an embodiment, the local media controller 135 includes a low power mode management component 113 to perform operations and functions as described in detail herein.

Memory device 130 receives control signals at the memory sub-system controller 115 from the local media controller 135 over a control link 232. For example, the control signals may include a chip enable CE #, a command latch enable CLE, an address latch enable ALE, a write enable WE #, a read enable RE #, and a write protect WP #. Additional or alternative control signals (not shown) may be further received over control link 232 depending upon the nature of the memory device 130. Memory device 130 receives command signals (which represent commands), address signals (which represent addresses), and data signals (which represent data) from the memory sub-system controller 115 over a multiplexed input/output (I/O) bus 234 and outputs data to the memory sub-system controller 115 over I/O bus 234.

For example, the commands may be received over input/output (I/O) pins [7:0] of I/O bus 234 at I/O control circuitry 212 and may then be written into command register 224. The addresses may be received over input/output (I/O) pins [7:0] of I/O bus 234 at I/O control circuitry 212 and may then be written into address register 214. The data may be received over input/output (I/O) pins [7:0] for an 8-bit device or input/output (I/O) pins [15:0] for a 16-bit device at I/O control circuitry 212 and then may be written into cache register 218. The data may be subsequently written into data register 220 for programming the array of memory cells 204.

In an embodiment, cache register 218 may be omitted, and the data may be written directly into data register 220. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 2 has been simplified. It should be recognized that the functionality of the various block components described with reference to FIG. 2 may not necessarily be segregated to distinct components or component portions of an integrated circuit device. For example, a single component or component portion of an integrated circuit device could be adapted to perform the functionality of more than one block component of FIG. 2. Alternatively, one or more components or component portions of an integrated circuit device could be combined to perform the functionality of a single block component of FIG. 2.

Additionally, while specific I/O pins are described in accordance with popular conventions for receipt and output of the various signals, it is noted that other combinations or numbers of I/O pins (or other I/O node structures) may be used in the various embodiments.

Figure 3:
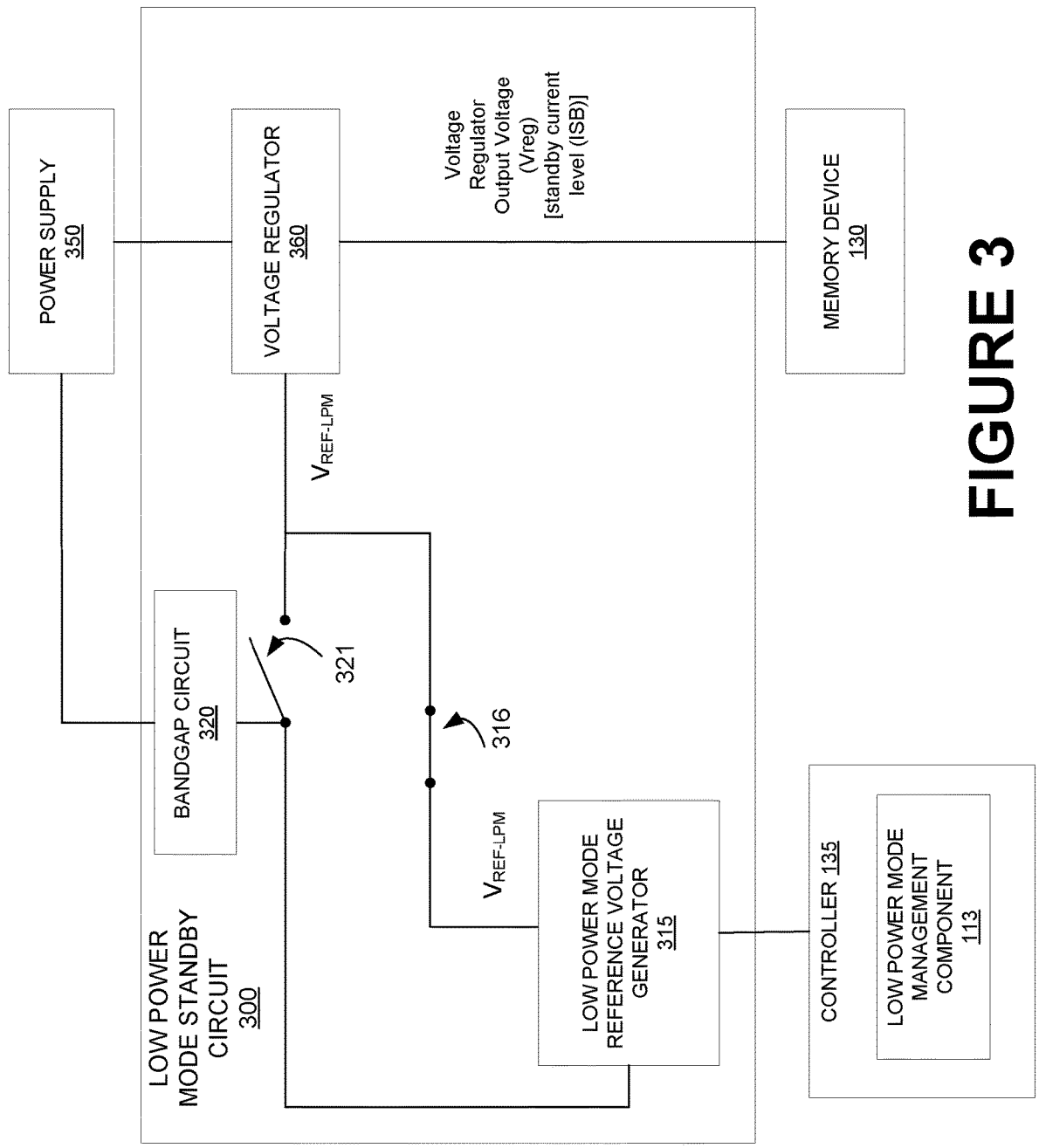
FIG. 3 illustrates an example low power mode management component associated with a memory sub-system in accordance with some embodiments of the present disclosure.

FIG. 3 illustrates an example controller 135 including a low power mode management component 113 configured to initiate commands or signals to control a low power mode standby circuit 300 to supply a standby current to a memory device 130 during operation in a sleep state (e.g., PS4). In an embodiment, as shown in FIG. 3, the low power mode standby circuit 300 includes a low power mode reference voltage generator 315. In response to a command from the low power mode management component 113, the low power mode reference voltage generator 315 is turned on (e.g., action 316) and generates a low power mode reference voltage ($V_{REF-LPM}$) that is supplied to a voltage regulator 360. In an embodiment, the low power mode reference voltage is set to a level (e.g., 1.6V) to enable the voltage regulator 360 to generate a corresponding output voltage level ($V_{reg}$) (e.g., 1.6V) to supply to the memory device.

In an embodiment, the low power mode management component 113 turns off the bandgap circuit 320 (e.g., action 321) of the low power mode standby circuit 300 when operating in the low power mode. By turning off the bandgap circuit, a lower level of standby current is consumed in connection with powering the memory device 130 during the sleep state.

In an embodiment, during the low power mode initiated by the low power mode management component 113, the power supply 350 (e.g., a battery associated with the memory sub-system) remains on (e.g., the power supply is maintained in a powered state). Advantageously, keeping the power supply 350 on enables lower entry and exit latencies and improved reliability of the memory device 130 by avoiding power cycling (e.g., as experienced by a typical system that turns the power supply off when the memory device is in the sleep mode).

In an embodiment, control of the low power mode standby circuit 300 by the low power mode management component 113 as shown in FIG. 3 results in a low standby current consumption level (e.g., 5 µA or less). In addition, the low power mode management component 113 causing entry into the low power mode while the power supply 350 remains on resulting in a reduced exit latency associated with transitioning the memory device 130 from the sleep state to an active state (e.g., latency levels of approximately 125 µs). Furthermore, keeping the power supply 350 on during the low power mode and entry into the sleep state reduces the number of power cycles of the power supply 350 which decreases read disturb concerns (e.g., increases reliability) and improves the life of the power supply 350 (e.g., due to fewer power cycles and initialization processing).

Figure 4:
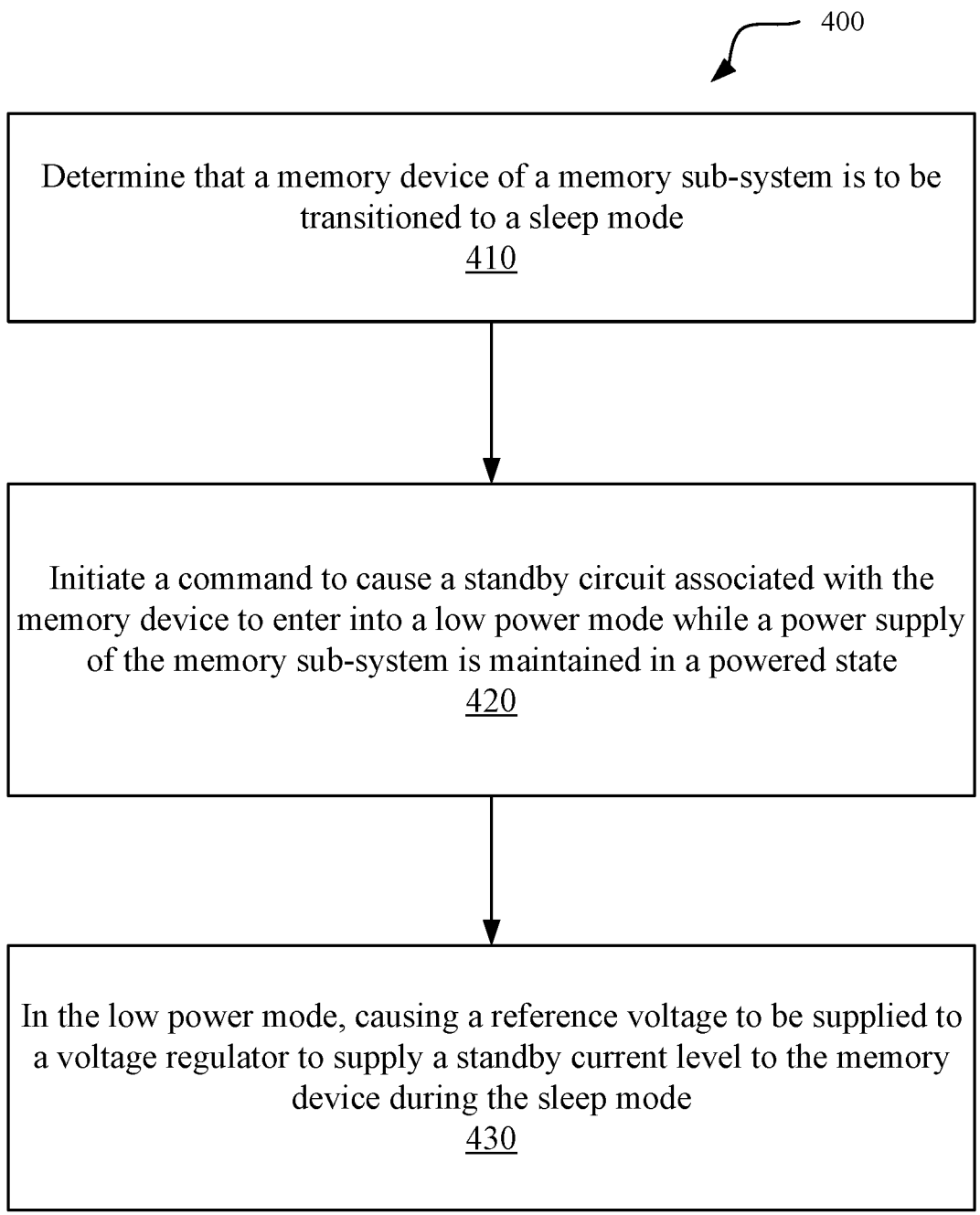
FIG. 4 a flow diagram of an example method associated with supplying a standby current level to a memory device in a low power mode of an idle state in accordance with some embodiments of the present disclosure.

FIG. 4 is a flow diagram of an example method 400 to manage a standby current level supplied to a memory device of a memory sub-system during an idle or sleep power state, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the low power mode management component 113 of FIGS. 1-3.

At operation 410, a determination is made. For example, the processing logic (e.g., the low power mode management component 113) determines whether a memory device of a memory sub-system is to be transitioned to a sleep mode or sleep state (e.g., an idle power state) or remain in an active state. In an embodiment, the sleep state is an idle power state during which the memory device is inactive and has a reduced power consumption level. In an embodiment, the transition to the sleep state can be determined by confirming an outstanding workload (e.g., a set of requested operations stored in a workload queue for processing by the memory device) is completed. In an embodiment, transition to the sleep mode can be determined by confirming the memory device is in an active idle state. In an embodiment, the memory sub-system can be transition from a power state associated with an active mode (e.g., a power level required to execute a workload) to an active idle state wherein no further operations are to be performed (e.g., the memory device is idle). In an embodiment, the memory sub-system can remain in the active idle state for a duration of time before it can be transitioned to a lower power state.

In operation 420, a command is initiated. For example, the processing logic initiates a command to cause a standby circuit associated with the memory device to enter into a low power mode while a power supply of the memory sub-system is on. In an embodiment, the power supply (e.g., an internal battery of the memory sub-system) remains on during entry and operation in the low power mode. In an embodiment, the standby circuit includes a component (e.g., the low power mode reference voltage generator 315 of FIG. 3) coupled to a voltage regulator that supplies a regulated output voltage to the memory device during the sleep mode operation. In an embodiment, the command to enter into the low power mode causes the component to turn on.

In operation 430, a voltage is supplied. For example, when the memory device is in the low power mode, the processing logic causes a reference voltage (e.g., $v_{REF-LPM}$ of FIG. 2) to be supplied to a voltage regulator (e.g., voltage regulator 360 of FIG. 3) of the standby circuit (e.g., low power mode standby circuit 300 of FIG. 3). Using the reference voltage, the voltage regulator generates a regulated output voltage level (e.g., Vreg of FIG. 3) to the memory device (e.g., memory device 130 of FIG. 3). The regulated voltage level supplied to the memory device is reduced or regulated to match the reference voltage level (e.g., approximately 1.6V). The use of the reference voltage level results in the generation of a reduced standby current level (e.g., approximately 5 µA or less) for consumption by the memory device during the sleep mode operation.

In an embodiment, entry into the low power mode can include turning off a bandgap circuit (e.g., bandgap circuit 320 of FIG. 3) of the standby circuit and turning on the reference voltage generator (e.g., low power mode reference voltage generator 315 of FIG. 3). Advantageously, supplying the voltage regulator with the reference voltage from the low power mode reference voltage generator enables a reduction in the standby leakage current, while the power supply remains powered on.

In an embodiment, the memory sub-system can transition from the sleep mode operation into an active power state (e.g., in response to activity or operations requests from a host system for performance by the memory device). Advantageously, since in the low power mode the power supply remains powered on, the exit latency (e.g., exiting the sleep mode) is reduced to lower level (e.g., 150 μs) as compared to typical systems that turn the power supply off when in the sleep mode. Furthermore, keeping the power supply on in the lower power mode of the sleep mode operation reduces a number of power cycles and initialization cycles by the power supply, which increases a length of a lifecycle of the power supply.

Figure 5:
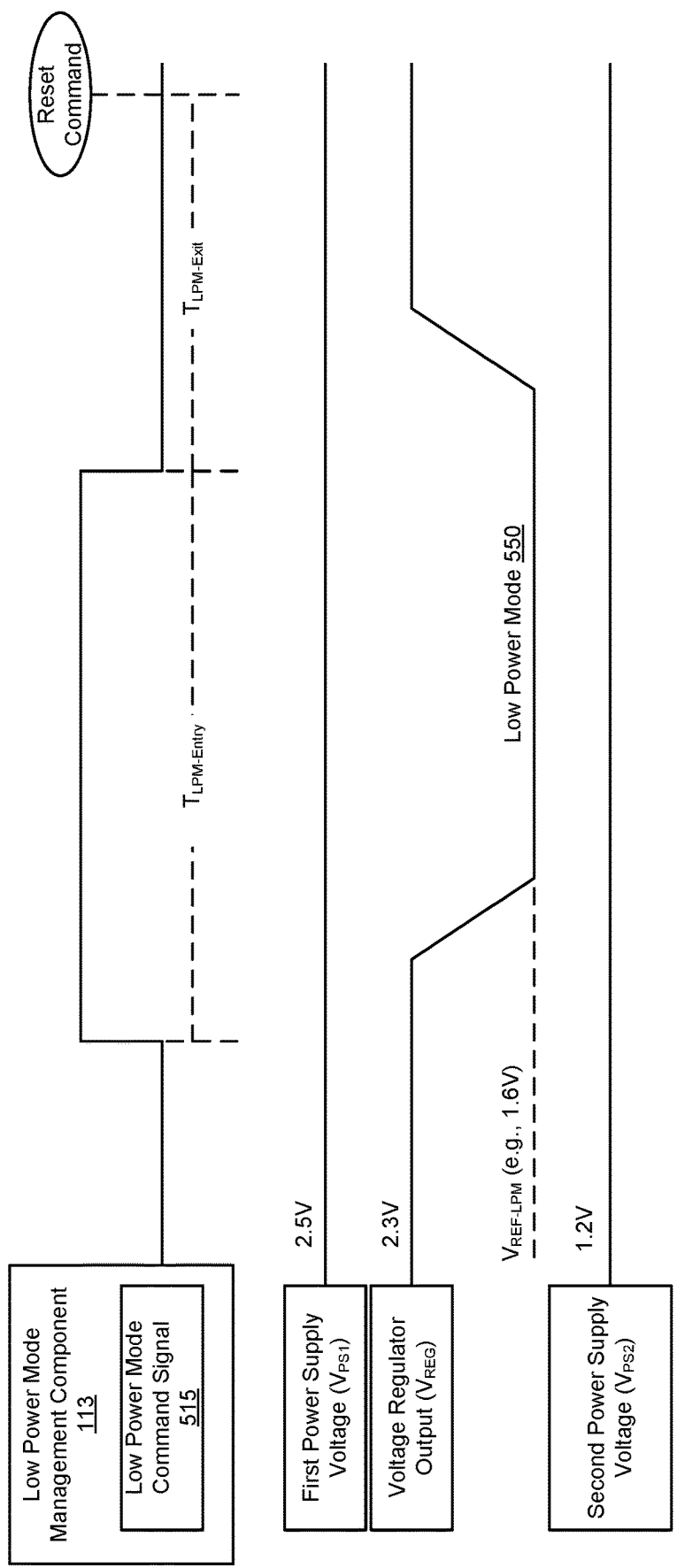
FIG. 5 is a diagram illustrating operating states of a memory sub-system in a low power mode with a secondary power supply powered on, in accordance with some embodiments of the present disclosure.

FIG. 5 illustrates an example low power mode management component 113 for generating a regulated standby current level for sleep mode operation of a memory sub-system including a first power supply and a second power supply (e.g., an external power supply associated with the memory sub-system), according to embodiments. In FIG. 5, the low power mode management component 113 generates a low power mode command signal to transition a standby circuit into low power mode while both the first power supply and the second power supply remain on. As shown in FIG. 5, the first power supply remains powered on and supplies a first power supply voltage level ($V_{PS1}$) (e.g., approximately 2.35V to 3.6V, shown as 2.5V in the example shown in FIG. 5) during operation in the low power mode. In the embodiment shown in FIG. 5, the second power supply remains powered on and supplies a second power supply voltage level ($V_{PS2}$) during operation in the low power mode.

In an embodiment, the low power mode management component 113 issues a command signal (e.g., a low power mode command signal 515) for entry into the low power mode of the sleep mode operation. In an embodiment, the command signal 515 can be issued in response to a determination that no pending workload (e.g., requested operations associated with the memory device) is pending and the memory sub-system is in an active idle state. In an embodiment, a time period ($T_{LPM-Entry}$) (e.g., less than 25 μs) can be used to enable the memory sub-system to stabilize when the second power supply is on. In an embodiment, in the low power mode, a reference voltage generator is switched on to supply a reference voltage (e.g., $V_{REF-LPM}$) to the voltage regulator to generate the voltage regulator output ($V_{REG}$). As shown in FIG. 5, the $V_{REF-LPM}$ and corresponding $V_{REG}$ are set to a reduced level (e.g., 1.6V) during operation in the lower power mode 550, which results in a managed standby current level (e.g., approximately 5 μs or less). As shown in FIG. 5, the first power supply and the second power supply remain on during the low power mode operation 550.

In an embodiment, the memory sub-system can be transitioned from the lower power mode (e.g., exited from the low power mode of the sleep mode operation) in response to the falling edge of the low power mode command signal 515. In an embodiment, a time period ($T_{LPM-Exit}$)(e.g., less than 100 μs) can be used to enable the memory sub-system to stabilize when the second power supply is on. In an embodiment, as shown in FIG. 5, the internal voltage level (e.g., $V_{REG}$) supplied to the memory device can be ramped up from the low power mode 550 level (e.g., 1.6V) to a threshold or normal operating level (e.g., 2.25V). In an embodiment, a reset command can be sent following the $T_{LPM-Exit}$ time period to clear the low power mode setting.

In an embodiment, at this stage, the memory device is in an active mode and ready to process operations, without the need to perform a trim loading process.

Figure 6:
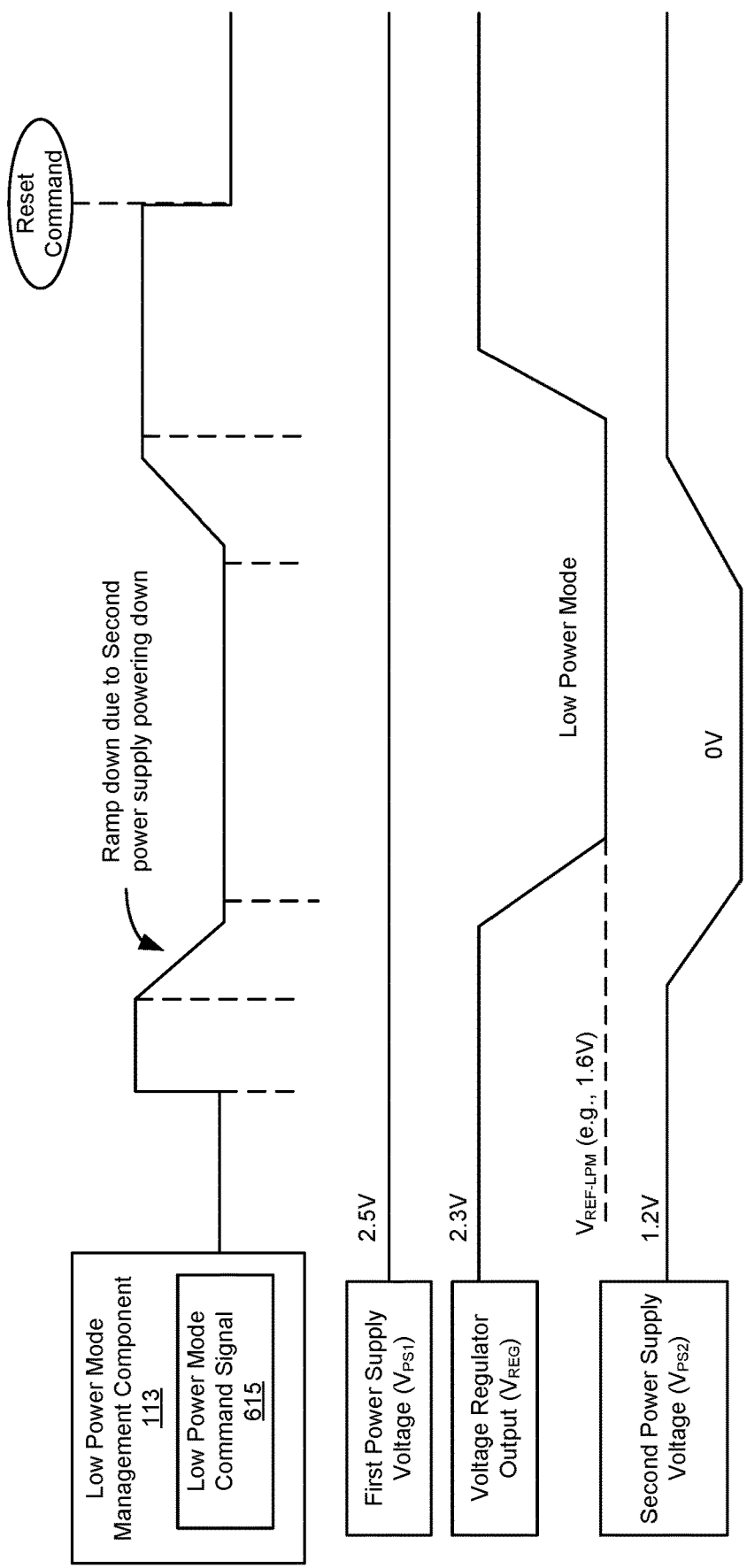
FIG. 6 is a diagram illustrating operating states of a memory sub-system in a low power mode with a secondary power supply powered off, in accordance with some embodiments of the present disclosure.

FIG. 6 illustrates an example low power mode management component 113 for generating a regulated standby current level for sleep mode operation of a memory sub-system including a first power supply and a second power supply (e.g., an external power supply associated with the memory sub-system), according to embodiments. In FIG. 6, the low power mode management component 113 generates a low power mode command signal to transition a standby circuit into low power mode while the first power supply is powered on and the second power supply executes a power cycle. As shown in FIG. 6, the first power supply remains powered on and supplies a first power supply voltage level ($V_{PS1}$) (e.g., approximately 2.35V to 3.6V, shown as 2.5V in the example shown in FIG. 6) during operation in the low power mode. In the embodiment shown in FIG. 6, the second power supply experiences a power cycle wherein the second power supply transitions from a powered on mode (e.g., supplying a $V_{PS2}$ of 1.2V) to a powered off mode (e.g., supplying a $V_{PS2}$ of 0V).

In an embodiment, entry into the low mode occurs when no pending workload (e.g., requested operations associated with the memory device) is pending and the memory sub-system is in an active idle state. In an embodiment, the low power mode command causes the second power supply to initiate a powering down operation causing a ramping down of the $V_{PS2}$ voltage. In an embodiment, the memory device can be switched to the low power mode (e.g., the low power mode component can supply the reference voltage to the voltage regulator to generate the $V_{REF\_LPM}$ level supplied to the memory device) following the powering down of the second power supply.

In an embodiment, the memory sub-system can be transitioned from the lower power mode (e.g., exited from the low power mode of the sleep mode operation) when the second power supply is powered off. In an embodiment, a controller of the memory sub-system can be used to restore the second power supply to a powered on mode. In an embodiment, a voltage detector can be used to restore the memory device to a normal standby mode of operation. In an embodiment, a delay (e.g., a delay of 50 μs or less to exit the low power mode and stabilize the memory sub-system when the second power supplied is powered off. In an embodiment, as shown in FIG. 6, the internal voltage (e.g., $V_{REG}$) supplied to the memory device can be ramped up from the low power mode 650 level (e.g., 1.6V) to a threshold or normal operating level (e.g., 2.25V). In an embodiment, a reset command can be sent to clear the low power mode setting. In an embodiment, at this stage, the memory device is placed in an active mode and ready to process operations, without the need to perform a trim loading process.

Figure 7:
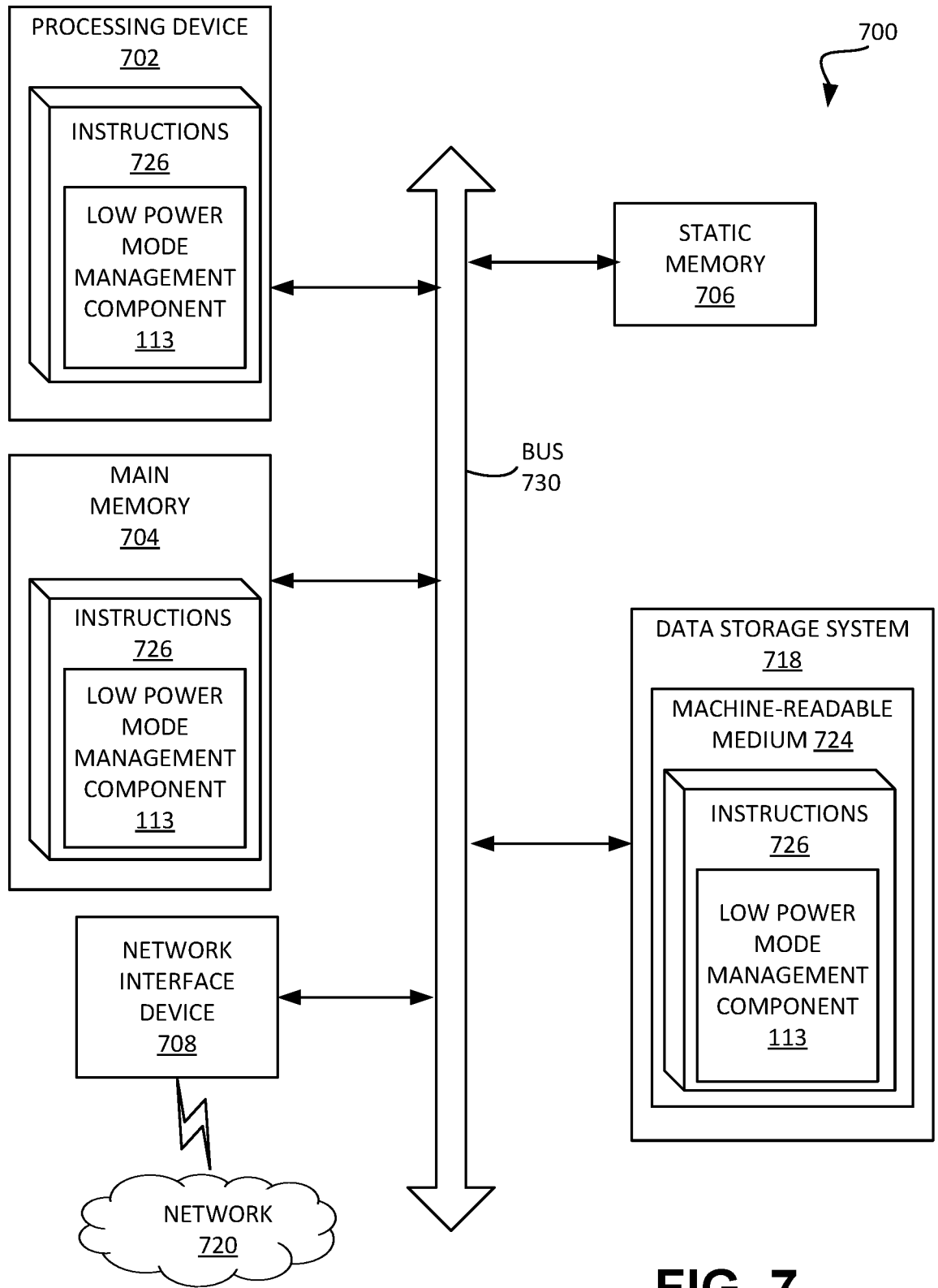
FIG. 7 is a block diagram of an example computer system in which embodiments of the present disclosure may operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the low power mode management component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 708 to communicate over the network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1.

In one embodiment, the instructions 726 include instructions to implement functionality corresponding to a selective relocation component (e.g., the low power mode management component 113 of FIG. 1). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
    determining, by a processing device of a controller of a memory sub-system, that a memory device of a memory sub-system is to be transitioned from an active mode to a sleep mode;
    initiating a command to cause a standby circuit associated with the memory device to enter into a low power mode while a power supply of the memory sub-system is maintained in a powered state; and
    in the low power mode, causing a reference voltage to be supplied to a voltage regulator, wherein the reference voltage causes the voltage regulator to supply a standby current level to the memory device during the sleep mode, wherein the standby current level is lower than a current level supplied when the memory device is in the active mode.

2. The method of claim 1, wherein the voltage regulator generates an output voltage that is limited based on the reference voltage.

3. The method of claim 1, wherein the standby current level is limited based on the reference voltage.

4. The method of claim 1, further comprising:
    in the low power mode, disabling supplying an output of a bandgap circuit of the standby circuit to the voltage regulator.

5. The method of claim 1, further comprising initiating an exit from the low power mode to transition the memory device from the sleep mode to an active mode.

6. The method of claim 5, wherein the power supply is in the powered state during transition of the memory device from the sleep mode to the active mode.

7. The method of claim 1, wherein determining the memory device is to be transitioned to the sleep mode further comprises:
    determining a workload queue associated with the memory device is empty; and
    determining the memory device is in an idle mode.

8. A non-transitory computer readable medium comprising instructions, which when executed by a processing device, cause the processing device to perform operations comprising:
    determining that a memory device of a memory sub-system is to be transitioned from an active mode to a sleep mode;
    initiating a command to cause a standby circuit associated with the memory device to enter into a low power mode while a power supply of the memory sub-system is maintained in a powered state; and
    in the low power mode, causing a reference voltage to be supplied to a voltage regulator, wherein the reference voltage causes the voltage regulator to supply a standby current level to the memory device during the sleep mode, wherein the standby current level is lower than a current level supplied when the memory device is in the active mode.

9. The non-transitory computer readable medium of claim 8, wherein a first power supply of the memory sub-system is powered on during operation the sleep mode.

10. The non-transitory computer readable medium of claim 9, wherein the memory sub-system further comprises a second power supply that is powered on during operation in the sleep mode.

11. The non-transitory computer readable medium of claim 9, wherein the memory sub-system further comprises a second power supply, and wherein the low power mode is entered following a powering down of the second power supply.

12. The non-transitory computer readable medium of claim 11, wherein the low power mode is exited following a powering up of the second power supply.

13. The non-transitory computer readable medium of claim 8, the operations further comprising in the low power mode, disabling supplying an output of a bandgap circuit of the standby circuit to the voltage regulator.

14. A memory sub-system comprising:
    a memory device comprising a standby circuit comprising a voltage regulator operatively coupled to one or more memory cells of the memory device; and
    control logic, operatively coupled with the standby circuit, to perform operations comprising:
    determining that the memory device is to be transitioned from an active mode to a sleep mode;
    initiating a command to cause the standby circuit to enter into a low power mode while a power supply of the memory sub-system is maintained in a powered state; and
    in the low power mode, causing a reference voltage to be supplied to a voltage regulator, wherein the reference voltage causes the voltage regulator to supply a standby current level to the memory device during the sleep mode, wherein the standby current level is lower than a current level supplied when the memory device is in the active mode.

15. The memory sub-system of claim 14, wherein the voltage regulator generates an output voltage that is limited based on the reference voltage.

16. The memory sub-system of claim 14, wherein the standby current level is limited based on the reference voltage.

17. The memory sub-system of claim 14, the operations further comprising, in the low power mode, disabling supplying an output of a bandgap circuit of the standby circuit to the voltage regulator.

18. The memory sub-system of claim 14, the operations further comprising initiating an exit from the low power mode to transition the memory device from the sleep mode to the active mode.

19. The memory sub-system of claim 18, wherein the power supply is in the powered state during the transition of the memory device from the sleep mode to the active mode.

20. The memory sub-system of claim 14, wherein determining the memory device is to be transitioned to the sleep mode further comprises:
    determining a workload queue associated with the memory device is empty; and
    determining the memory device is in an idle mode.

* * * * *